(12) United States Patent
Gadde et al.

(10) Patent No.: US 11,190,155 B2
(45) Date of Patent: Nov. 30, 2021

(54) LEARNING AUXILIARY FEATURE PREFERENCES AND CONTROLLING THE AUXILIARY DEVICES BASED THEREON

(71) Applicant: Toyota Motor North America, Inc., Plano, TX (US)

(72) Inventors: Sai Prithvi Gadde, Dallas, TX (US); Harjot Singh, Plano, TX (US); Ethan Pomish, Livonia, MI (US)

(73) Assignee: TOYOTA MOTOR NORTH AMERICA, INC., Plano, TX (US)

( * ) Notice: Subject to any disclaimer, the term of this patent is extended or adjusted under 35 U.S.C. 154(b) by 82 days.

(21) Appl. No.: 16/559,334

(22) Filed: Sep. 3, 2019

(65) Prior Publication Data

US 2021/0067119 A1 Mar. 4, 2021

(51) Int. Cl.

| | | |
|---|---|---|
| *G06F 3/16* | (2006.01) | |
| *H03G 3/30* | (2006.01) | |
| *G08G 1/0965* | (2006.01) | |
| *H04R 1/02* | (2006.01) | |
| *H04R 29/00* | (2006.01) | |
| *G10L 25/51* | (2013.01) | |
| *B60S 1/08* | (2006.01) | |
| *G10L 17/00* | (2013.01) | |

(52) U.S. Cl.
CPC .......... *H03G 3/3005* (2013.01); *B60S 1/0822* (2013.01); *G06F 3/165* (2013.01); *G08G 1/0965* (2013.01); *G10L 17/00* (2013.01); *G10L 25/51* (2013.01); *H04R 1/025* (2013.01); *H04R 29/001* (2013.01); *H03G 2201/103* (2013.01); *H04R 2499/13* (2013.01)

(58) Field of Classification Search
CPC .... H04R 1/406; H04R 1/025; H04R 2499/13; H04R 1/08; H04R 5/023; H03G 5/165; H03G 7/007; H03G 3/32; B60H 1/00742; B60R 16/037; B60R 16/0373; G10L 15/20; G10L 17/00; G08G 1/0965; G01C 21/3691; G06F 3/165
USPC ........ 381/56, 57, 17.4, 71.12, 71.14, 86, 85, 381/98, 103, 104, 110, 94.2, 59; 704/275, 246
See application file for complete search history.

(56) References Cited

U.S. PATENT DOCUMENTS

| | | |
|---|---|---|
| 5,073,944 A | 12/1991 | Hirasa |
| 7,020,549 B2 | 3/2006 | Nakaya et al. |
| 7,058,183 B2 | 6/2006 | Hasegawa et al. |
| 7,516,065 B2 | 4/2009 | Marumoto |
| 7,689,233 B2 | 3/2010 | Cao et al. |

(Continued)

FOREIGN PATENT DOCUMENTS

JP 2009014653 A 1/2009

*Primary Examiner* — Paul Kim
*Assistant Examiner* — Ubachukwu A Odunukwe
(74) *Attorney, Agent, or Firm* — Snell & Wilmer LLP

(57) ABSTRACT

A system for audio control in a vehicle includes a speaker designed to output vehicle audio data in a cabin of the vehicle at a volume. The system further includes a microphone designed to detect microphone data in the cabin of the vehicle. The system further includes a memory designed to store an audio profile corresponding to desirable operation of the volume of the speaker. The system also includes an electronic control unit (ECU) coupled to the speaker, the microphone, and the memory and designed to control the volume of the speaker based on the detected microphone data and the audio profile.

19 Claims, 4 Drawing Sheets

(56) References Cited

U.S. PATENT DOCUMENTS

| | | |
|---|---|---|
| 7,689,423 B2 | 3/2010 | Bicego et al. |
| 8,669,858 B2 | 3/2014 | Yoshino et al. |
| 9,648,415 B2 | 5/2017 | Sakakibara et al. |
| 9,792,801 B2 | 10/2017 | Savolainen et al. |
| 9,851,937 B2 | 12/2017 | Jang |
| 9,861,905 B2 | 1/2018 | Allmendinger et al. |
| 10,020,785 B2 | 7/2018 | Kanagaraj et al. |
| 2008/0270131 A1* | 10/2008 | Fukuda .................. G10L 15/20 704/246 |
| 2011/0044474 A1 | 2/2011 | Grover |
| 2014/0074480 A1* | 3/2014 | Gratke ............... B60R 16/0373 704/275 |
| 2014/0185828 A1* | 7/2014 | Helbling ............... H03G 5/165 381/103 |
| 2016/0173049 A1* | 6/2016 | Mehta ..................... H03G 3/32 381/57 |
| 2017/0243171 A1 | 8/2017 | Bellamy et al. |
| 2018/0164119 A1* | 6/2018 | Becker ............... G01C 21/3691 |
| 2019/0165750 A1* | 5/2019 | Goldman-Shenhar ....................... H03G 7/007 |
| 2020/0329307 A1* | 10/2020 | Groene ................. H04R 5/023 |

\* cited by examiner

LEARNING AUXILIARY FEATURE PREFERENCES AND CONTROLLING THE AUXILIARY DEVICES BASED THEREON

BACKGROUND

1. Field

The present disclosure relates to systems and methods for learning user preferences for auxiliary components, such as audio systems, of a vehicle and for controlling the auxiliary components based on the learned preferences.

2. Description of the Related Art

Vehicle designs include more sensors than ever before, and the advance of computing abilities has allowed vehicles to perform more functions than at any previous time. Due to this increase in sensors and computing ability, vehicles are now capable of detecting information corresponding to their environment, analyzing the information, and implementing actions based on the analysis. For example, radar and image sensors can be used to identify objects near the vehicle, and autonomous vehicles can even drive themselves based on the detected objects (and other information).

Vehicles are also capable of identifying actions taken by vehicle drivers or passengers, such as how the individual interacts with auxiliary vehicle components (such as a radio, windshield wipers, etc.). However, with the recent focus on self-driving (i.e., autonomous) vehicles, not as much development has occurred with this auxiliary component data, although these components or features are what drivers interact with most in vehicles.

Thus, there is a need in the art for systems and methods for learning how users interact with auxiliary vehicle components and using that information to improve the customer driving experience.

SUMMARY

Described herein is a system for audio control in a vehicle. The system includes a speaker designed to output vehicle audio data in a cabin of the vehicle at a volume. The system further includes a microphone designed to detect microphone data in the cabin of the vehicle. The system further includes a memory designed to store an audio profile corresponding to desirable operation of the volume of the speaker. The system also includes an electronic control unit (ECU) coupled to the speaker, the microphone, and the memory and designed to control the volume of the speaker based on the detected microphone data and the audio profile.

Also described is a system for audio control in a vehicle. The system includes a speaker designed to output vehicle audio data in a cabin of the vehicle at a volume. The system further includes a volume control input device designed to receive user input corresponding to a desired volume of the speaker. The system also includes a microphone designed to detect microphone data in the cabin of the vehicle. The system further includes a memory designed to store an audio profile corresponding to desirable operation of the volume of the speaker. The system also includes an electronic control unit (ECU) coupled to the speaker, the microphone, and the memory. The ECU is designed to learn user volume preferences in multiple environments based on historical user input and corresponding historical microphone data. The ECU is further designed to update the audio profile with the learned user volume preferences in the multiple environments. The ECU is also designed to control the volume of the speaker based on the detected microphone data and the audio profile.

Also described is a method for audio control in a vehicle. The method includes outputting, by a speaker, vehicle audio data in a cabin of the vehicle. The method further includes detecting, by a microphone, microphone data in the cabin of the vehicle. The method further includes storing, in a memory, an audio profile corresponding to desirable operation of the volume of the speaker. The method further includes controlling, by an electronic control unit (ECU), the volume of the speaker based on the detected microphone data and the audio profile.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

The present disclosure describes systems and methods for learning auxiliary feature preferences and controlling auxiliary vehicle devices based on the preferences. The system provides benefits and advantages such as learning how users interact with auxiliary devices, such as audio systems, and automatically controlling the auxiliary devices based on this learning. This provides the advantage of reducing driver interaction with these auxiliary devices, beneficially increasing vehicle safety due to reduced distractions of the driver. The systems provide additional advantages such as utilizing data from these auxiliary devices (such as microphones) to identify information external to the vehicle (such as the presence of rain or an approaching police vehicle). This can advantageously supplement information from other vehicle sensors, allowing the vehicle to more robustly identify and utilize this external information. The systems can also provide the benefit of alerting nearby vehicles to the information external to the vehicle, allowing the nearby vehicles to take actions before they can detect the information themselves. For example, a vehicle can alert nearby vehicles if a microphone detects the presence of a police vehicle, allowing the nearby vehicles to move out of the way and allowing the police vehicle to cruise to its destination at a faster speed.

An exemplary system includes a microphone and a speaker. The system also includes an input device, such as a volume control knob. The system also includes an electronic control unit (ECU) coupled to the microphone and the speaker. The ECU can learn how a driver or passenger interacts with the input device in various situations, and can identify the situations based on the microphone data. For example, the ECU can determine that a passenger has difficulty hearing voices of a specific frequency if the passenger turns down the volume of music when people who speak at the specific frequency are talking. The ECU can take further action if the specific situation arises again by, for example, automatically turning down the volume when an individual who speaks at the specific frequency begins talking.

Figure 1:
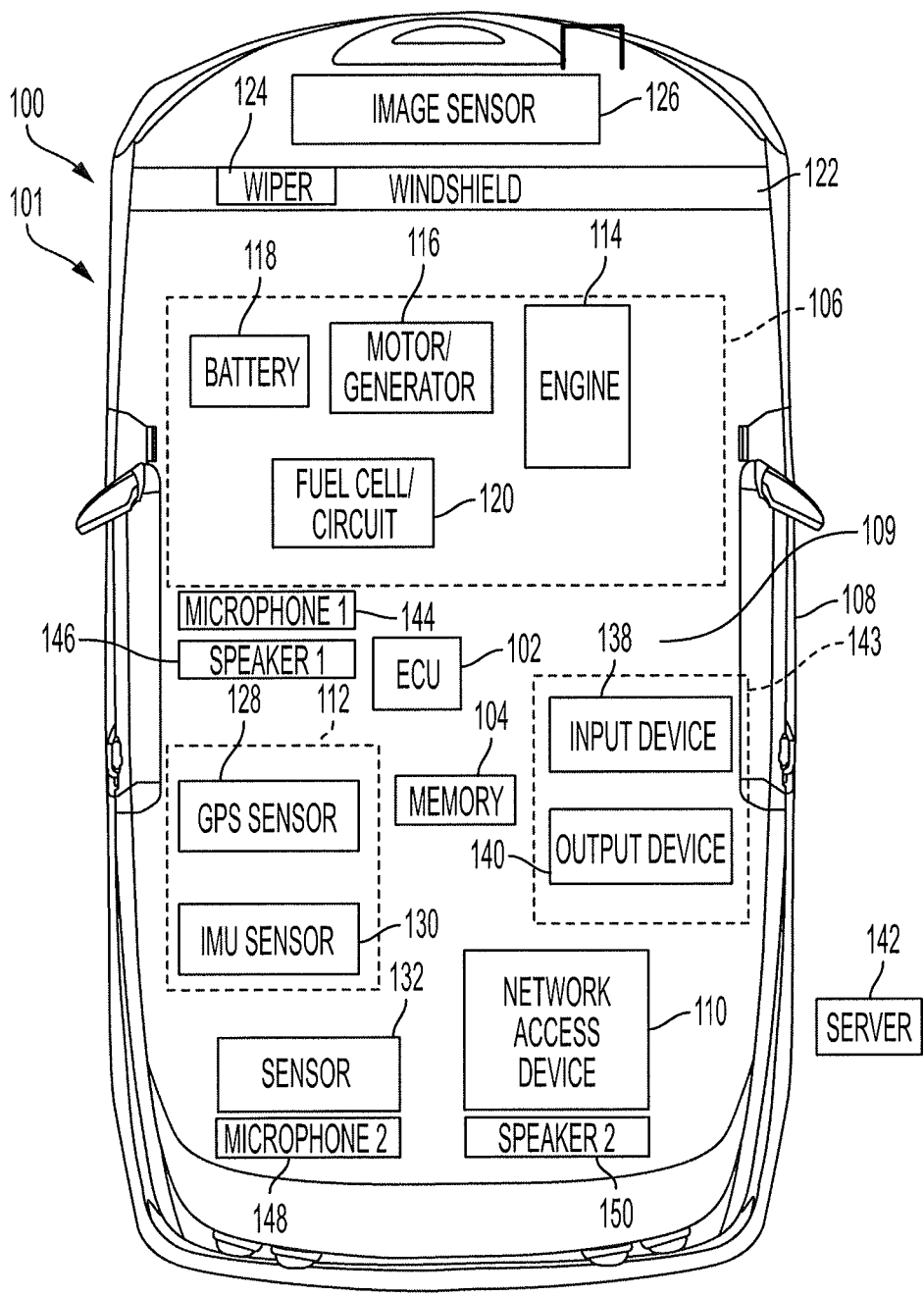
FIG. 1 is a block diagram illustrating a system and a vehicle for learning auxiliary feature preferences and controlling auxiliary vehicle devices based on the preferences according to an embodiment of the present invention.

Turning to FIG. 1, a vehicle 100 may be part of, or include, a system 101 for controlling auxiliary vehicle components based on learned user preferences. The vehicle 100 (or system 101) may include an ECU 102, a memory 104, a power source 106, and a main body 108. The vehicle 100 (or system 101) may further include a network access device 110, a location sensor 112, an image sensor 126, and a sensor 132. The vehicle may also include a multimedia unit 143 including at least one input device 138 and at least one output device 140.

The main body 108 may be propelled along a roadway, may be suspended in or on water, or may fly through air. The main body 108 may resemble a vehicle such as a car, a bus, a motorcycle, a boat, an aircraft, or the like. The main body 108 may further support one or more individual such as a driver, a passenger, or the like. The main body 108 may define a vehicle cabin 109.

The main body 108 may include a windshield 122 that at least partially encloses the vehicle cabin 109 and provides an area for viewing an environment of the vehicle 100. The windshield 122 may include a windshield wiper 124 that removes rainwater and debris from the windshield 122 to facilitate visibility of the vehicle environment.

The ECU 102 may be coupled to each of the components of the vehicle 100 and may include one or more processors or controllers, which may be specifically designed for automotive systems. The functions of the ECU 102 may be implemented in a single ECU or in multiple ECUs. The ECU 102 may receive data from components of the vehicle 100, may make determinations based on the received data, and may control the operations of the components based on the determinations.

The vehicle 100 may be non-autonomous, fully autonomous, or semi-autonomous. In that regard, the ECU 102 may control various aspects of the vehicle 100 (such as steering, braking, accelerating, or the like) to maneuver the vehicle 100 from a starting location to a destination. In some embodiments, the vehicle 100 may be operated in an autonomous, semi-autonomous, or fully driver-operated state. In that regard, the vehicle 100 may be operated independently of driver control and, from time to time, without a person inside of the vehicle 100. The ECU 102 may facilitate such autonomous functionality.

The memory 104 may include any non-transitory memory and may store data usable by the ECU 102. For example, the memory 104 may store map data, may store an audio profile corresponding to user-preferred operation of an audio system of the vehicle (e.g., a microphone, speaker, radio, etc.), may store instructions usable by the ECU 102 to drive autonomously, or the like.

The power source 106 may include any one or more of an engine 114, a motor-generator 116, a battery 118, or a fuel-cell circuit 120. The engine 114 may convert a fuel into mechanical power for propelling the vehicle 100. In that regard, the engine 114 may be a gasoline engine, a diesel engine, an ethanol engine, or the like.

The battery 118 may store electrical energy. In some embodiments, the battery 118 may include any one or more energy storage device including a battery, a flywheel, a super capacitor, a thermal storage device, or the like.

The fuel-cell circuit 120 may include a plurality of fuel cells that facilitate a chemical reaction to generate electrical energy. For example, the fuel cells may receive hydrogen and oxygen, facilitate a reaction between the hydrogen and the oxygen, and output electricity in response to the reaction. In that regard, the electrical energy generated by the fuel-cell circuit 120 may be stored in the battery 118 and/or used by the motor-generator 116. In some embodiments, the vehicle 100 may include multiple fuel-cell circuits including the fuel-cell circuit 120.

The motor-generator 116 may convert the electrical energy stored in the battery 118 (or electrical energy received directly from the fuel-cell circuit 120) into mechanical power usable to propel the vehicle 100. The motor-generator 116 may further convert mechanical power received from the engine 114 or from wheels of the vehicle 100 into electricity, which may be stored in the battery 118 as energy and/or used by other components of the vehicle 100. In some embodiments, the motor-generator 116 may include a motor without a generator portion and, in some embodiments, a separate generator may be provided.

The location sensor 112 may include any sensor capable of detecting data corresponding to a current location of the vehicle 100. For example, the location sensor 112 may include one or more of a global positioning system (GPS) sensor 128, an inertial measurement unit (IMU) sensor 130, or the like. The GPS sensor 128 may detect data corresponding to a location of the vehicle. For example, the GPS sensor 128 may detect global positioning coordinates of the vehicle 100. The IMU sensor 130 may include one or more of an accelerometer, a gyroscope, or the like. The IMU sensor 130 may detect inertial measurement data corresponding to a position, a velocity, an orientation, an acceleration, or the like of the vehicle 100. The inertial measurement data may be used to identify a change in location of the vehicle 100, which the ECU 102 may track in order to determine a current location of the vehicle 100.

The image sensor 126 may include any one or more sensor capable of detecting image data. For example, the image sensor 126 may include a camera capable of detecting light in the human-visible spectrum, infrared light, ultraviolet light, or light having any frequency. The image sensor 126 may also or instead include a radar detector, a LIDAR detector, or the like. The radar/LIDAR sensor may be capable of detecting objects in the vicinity of the vehicle 100, which may be analyzed or converted to another form for analysis. The image sensor 126 may be located at any position on the vehicle 100 and may be oriented in any direction. For example, the image sensor 126 may include a camera oriented to detect data in front of the vehicle, two cameras each oriented to detect data on the sides of the vehicle, and a radar sensor oriented to detect radar data in front of the vehicle.

The sensor 132 may include one or more of the location sensor 112, a brake sensor to detect an amount of braking, an acceleration sensor configured to detect acceleration of the vehicle 100, a turning sensor configured to detect a turning radius of the vehicle 100, or the like. As additional examples, the sensor 132 may include one or more of a grade sensor designed to detect a grade of a current roadway, an altimeter designed to detect an altitude of the vehicle 100, a speed sensor (such as an angular velocity sensor coupled to one or more wheel) designed to detect a speed of the vehicle 100, or the like. The sensor 132 may also or instead include one or more of a voltage sensor, a current sensor, a temperature sensor, a pressure sensor, a fuel gauge, an airflow sensor, an oxygen sensor, and/or the like.

The input device 138 may include any one or more input device such as a button, a keyboard, a mouse, a touchscreen, a microphone, or the like. The input device 138 may receive input from a user of the vehicle 100 such as a driver or a passenger.

In some embodiments, the input device 138 may include one or more microphone including a first microphone 144 and a second microphone 148. The first microphone 144 and the second microphone 148 may be located at different locations relative to the main body 108. For example, the first microphone 144 may be located in a front of the vehicle cabin 109 and be capable of detecting audio data from a front seat of the vehicle 100, and the second microphone 148 may be located in a back of the vehicle cabin 109 and be capable of detecting audio data from a back seat of the vehicle 100. As another example, the first microphone 144 may be capable of detecting audio inside the vehicle cabin 109 and the second microphone 148 may be capable of detecting audio outside of the main body 108.

The input device 138 may further receive user input corresponding to desired control of one or more vehicle component. For example, the input device 138 may include a volume knob for an audio system, an input for controlling operation of an air conditioning system, one or more cruise control button, or the like.

The output device 140 may include any output device such as a speaker, a display, a touchscreen, or the like. The output device 140 may output data to a user of the vehicle such as a determined route from a starting location to a destination.

In some embodiments, the output device 140 may include one or more speaker, such as a first speaker 146 and a second speaker 150. The first speaker 146 and the second speaker 150 may be located in different locations relative to the vehicle 100. For example, the first speaker 146 may output audio in a front of the vehicle cabin 109 and the second speaker 150 may output audio in a back of the vehicle cabin 109.

The network access device 110 may include any network access device capable of communicating via a wireless protocol. For example, the network access device 110 may communicate via Bluetooth, Wi-Fi, a cellular protocol, vehicle to vehicle (V2V) communications, Zigbee, or any other wired or wireless protocol. The network access device 110 may be referred to as a data communication module (DCM) and may communicate with any device on the vehicle 100 and/or any remote device.

The network access device 110 may communicate with a remote server 142 (such as a cloud server or other central server). The remote server 142 may receive information from the vehicle 100 corresponding to user control of auxiliary components and corresponding environmental characteristics detected by one or more sensor of the vehicle 100. For example, the first microphone 144 may detect speech having a certain frequency and the input device 138 may receive user input corresponding to turning down the volume of the first speaker 146. In that regard, the data transmitted to the remote server 142 may include that a user of the vehicle 100 turned down the volume in response to the speech having the certain frequency.

The server 142 may analyze this information, along with other corresponding information from the vehicle 100, and determine user preferences relating to control of the auxiliary vehicle components. The server 142 may generate an audio profile that includes the user preferences and may transmit the audio profile to the vehicle. The ECU 102 may then use the audio profile to control the auxiliary components of the vehicle based on currently detected data. For example, if the microphone 144 detects user speech of the certain frequency then the ECU 102 may automatically turn down the volume of the speaker 146.

In some embodiments, the ECU 102 may generate its own audio profile in a similar manner as the remote server 142. The ECU 102 may transmit the audio profile to the remote server 142 for storage, may store the audio profile in the memory 104, or both.

The network access device 110 may further communicate with other vehicles. For example, the first microphone 144 may detect the sound of a siren of a police vehicle. In some embodiments, the first microphone 144 may determine that the sound of the siren is coming from a rear of the vehicle 100, indicating that the vehicle 100 should move to a right lane and slow down or come to a stop. The ECU 102 may control the network access device 110 to transmit a notification to nearby vehicles that the police vehicle is approaching in order to alert the other vehicles that they should likewise move to the right lane and slow down or come to a stop.

Figure 2:
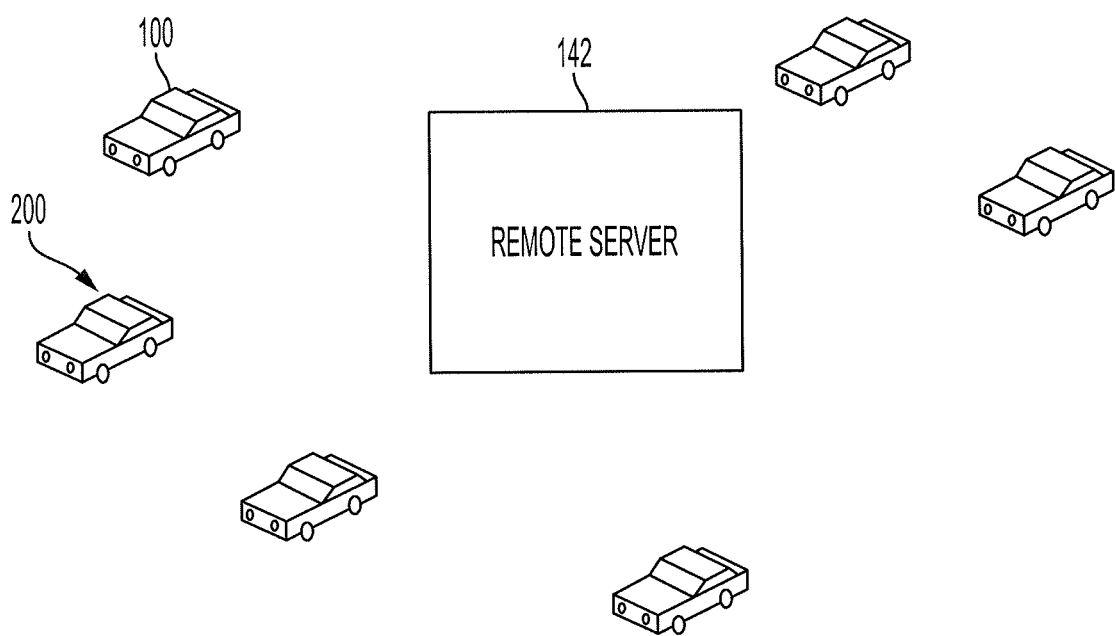
FIG. 2 is a block diagram illustrating a system for learning auxiliary feature preferences and controlling auxiliary vehicle devices based on the preferences according to an embodiment of the present invention.

Referring now to FIG. 2, the remote server 142 may communicate with multiple vehicles 200 including the vehicle 100. The remote server 142 may receive information from the vehicles 200 corresponding to user control of auxiliary components along with corresponding environmental characteristics detected by one or more sensor of the vehicles 200 (such as a microphone). The remote server 142 may further generate audio profiles for each of the vehicles based on the received information.

In some embodiments, the remote server 142 may also analyze the information from each of the vehicles 200 to determine generally-desired control of auxiliary components of vehicles, and may incorporate the generally-desired control into each of the audio profiles. For example, the server 142 may determine that most passengers or drivers prefer to have the volume not exceed a certain volume level, and may instruct the vehicles 200 to not exceed the volume level unless explicitly requested by drivers or passengers.

The analysis of the information from each of the vehicles 200 may be utilized by vehicle manufacturers when designing new vehicles or updates to vehicles. For example, an operator of the server 142 may sell the information or the analysis of the information to vehicle manufacturers, who may use the information and knowledge gleaned from the analysis to drive design of new vehicle features. Continuing the above example, vehicle manufacturers may design stereo systems to have a maximum volume level at or near the volume level referenced above.

Figure 3:
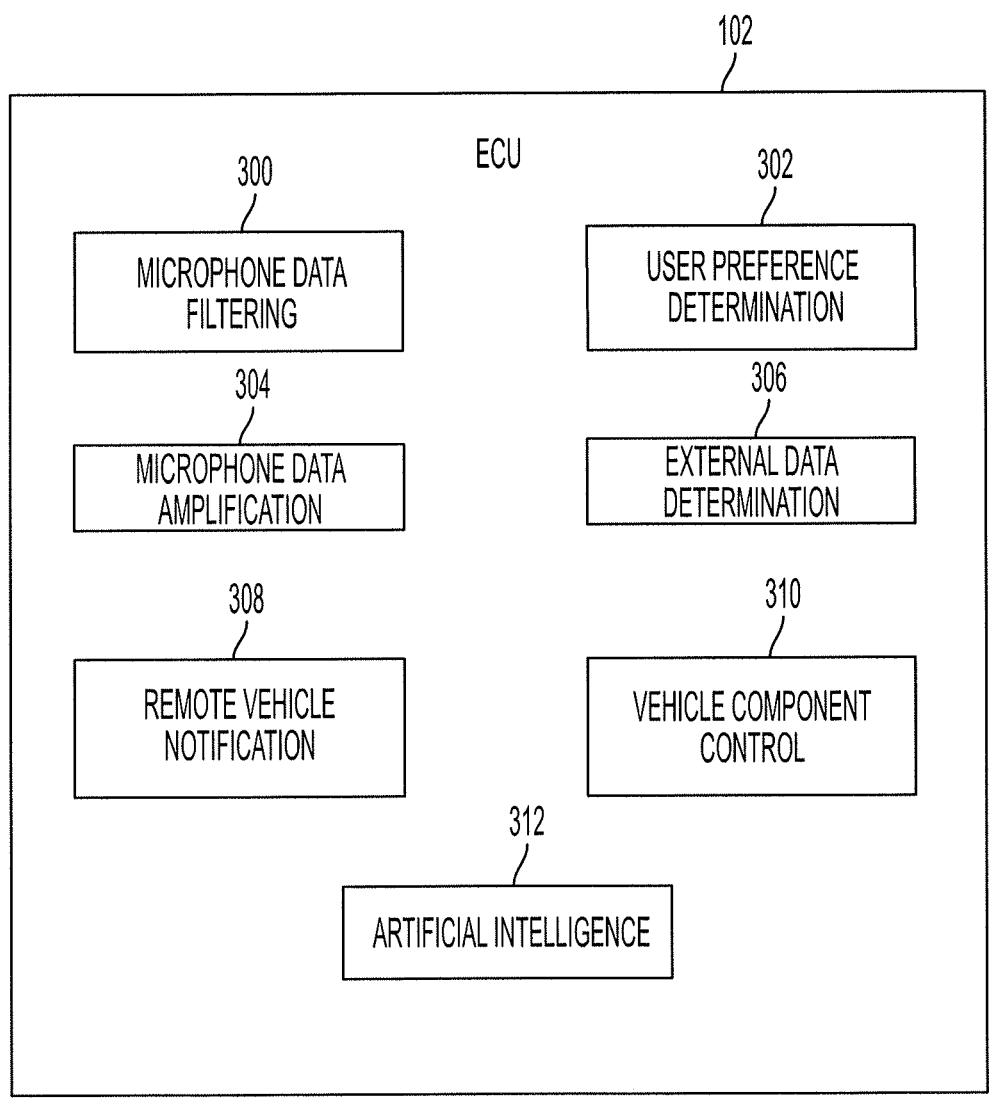
FIG. 3 is a block diagram illustrating features of an electronic control unit (ECU) of the vehicle of FIG. 1 according to an embodiment of the present invention.

Referring now to FIG. 3, additional details of the ECU 102 are shown. The ECU 102 may be designed to perform various algorithms, or functions. Some of these algorithms are illustrated in FIG. 3, however, one skilled in the art will realize that the ECU 102 may perform additional algorithms or functions not shown in FIG. 3, may perform all algorithms shown in FIG. 3, may only perform some algorithms shown in FIG. 3, or the like.

The ECU 102 may perform a microphone data filtering algorithm 300. The filtering algorithm 300 may filter and analyze audio data detected by one or more microphone of the vehicle. The algorithm 300 may analyze features of the microphone data to identify each source of audio in the microphone data as well as identify specific characteristics of each source. For example, the algorithm 300 may identify a first source of audio as originating from a vehicle adjacent to the present vehicle, a second source of audio as originating from a specific passenger in the vehicle, and a third source of audio as originating from music playing from a speaker in the vehicle. The algorithm 300 may further identify characteristics of each of the sources of audio such as a volume of each source, a frequency of each source, or the like.

The algorithm 300 may use specific filters to filter the microphone data. For example, the algorithm 300 may use sub-spectral subtraction or Kalman filtering to perform the filtering tasks. The filter may separate the different sources of audio from the microphone data, and the algorithm 300 may then determine the characteristics of each source of audio. The algorithm 300 may identify the source of each piece of audio based on the determined characteristics.

The ECU 102 may further perform a user preference determination algorithm 302. The algorithm 302 may analyze the results of the filtering algorithm 300 along with corresponding user input to determine user preferences regarding control of an auxiliary component (e.g., volume control of a speaker). Continuing the above example, the algorithm 302 may determine that a user always turns down the volume of music to a certain volume level when speech having the specific frequency also occurs in the vehicle. By always turning down the volume in this situation, the algorithm 302 may learn that the user has difficulty hearing people who speak at the specific frequency. The algorithm 302 may thus determine that the user has a preference for music to be turned down at least to the certain volume level when speech having the specific frequency occurs in the vehicle.

The ECU 102 may further perform a microphone data amplification algorithm 304. The ECU 102 may learn that a certain vehicle passenger has difficulty hearing other passengers who sit in a different vehicle row (e.g., the certain passenger in the back row and the other passengers in the front row). The ECU may identify the certain vehicle passenger and his sitting location, for example, based on image data detected by a camera in the vehicle. When the certain vehicle passenger is in a backseat, the algorithm 304 may amplify the microphone data corresponding to other vehicle passengers (e.g., in the front seat) and may output the amplified speech using a speaker in the back row of the vehicle. As another example, the ECU may learn that a vehicle passenger always has difficulty hearing other passengers in the vehicle. The algorithm 304 may identify that the vehicle passenger is in the vehicle and may always amplify and output speech from other vehicle passengers. The algorithm 304 may also reduce the volume of other audio being output by the speakers (e.g., music).

The ECU 102 may learn of the hearing difficulty of a passenger in multiple ways. For example, a camera and an input device may learn that a specific user always turns the speaker volume down when other passengers speak. As another example, the ECU 102 may receive microphone data indicating that the passenger with difficulty hearing usually asks other passengers to repeat themselves after they speak. As yet another example, the ECU 102 may learn that the passenger misinterprets speech of other passengers based on responses given by the first passenger. For example, the ECU 102 may monitor the microphone data and find multiple instances of the first passenger giving a nonsensical answer to a question (e.g., another passenger may ask "where would you like to go," and the first passenger may respond "blue").

The algorithm 304 may further identify that one or more individual in the vehicle has difficulty hearing other passengers (or audio output by the speaker) when a volume of ambient noise is greater than a certain noise level. For example, the ambient noise may be caused by other vehicles (e.g., a loud motorcycle), road construction, or the like. When the ECU 102 identifies that the ambient noise is greater than the noise level, the ECU 102 may amplify and output any speech detected in the vehicle, amplify music being played from the speaker, or the like.

The ECU 102 may also perform an external data determination algorithm 306. The external data determination algorithm 306 may identify the presence, and potentially location, of objects or other information in an environment of the vehicle based on the microphone data. For example, the algorithm 306 may identify the presence of an ambulance siren. The algorithm 306 may further determine a location of the object or information in the environment of the vehicle (e.g., that the ambulance is located behind the vehicle, or headed towards the vehicle) based on a triangulation of the ambulance siren from one or more microphone, based on the doppler effect, or the like.

As another example, the algorithm 306 may identify the presence of rain, thunder, or the like in the environment of the vehicle based on the microphone data. For example, the microphone data may include the sound of raindrops on a windshield or roof of the vehicle, or may include the sound of thunder in the distance. The algorithm 306 may identify the rain or thunder based on the sound in the microphone data.

The ECU 102 may also perform a remote vehicle notification algorithm 308. The algorithm 308 may notify vehicles within communication range, or within a predetermined distance of the present vehicle, of information obtained from the microphone data. For example, if the ECU 102 identifies that an emergency vehicle is approaching the present vehicle from behind based on the microphone data, the ECU 102 may transmit a notification of the approaching emergency vehicle (potentially along with a location or heading of the emergency vehicle) to other vehicles in the vicinity of the present vehicle. As another example, if the ECU 102 identifies raindrops hitting the vehicle, the ECU 102 may transmit a notification that it is presently raining to other vehicles.

The ECU 102 may further perform a vehicle component control algorithm 310. The algorithm 310 may control various components of the vehicle based on any of the information determined by any other algorithm, based on user input, based on the microphone data, or the like. For example, if the algorithm 302 determines that a passenger has difficulty hearing speech of a specific frequency and the microphone data includes speech of the specific frequency then the algorithm 310 may reduce the volume of music output by a speaker to increase the ability of the passenger to hear the speech. As another example, if the algorithm 306 determines that it is raining in the environment of the vehicle then the algorithm 310 may control windshield wipers of the vehicle to turn on. Continuing the example, the algorithm 306 may determine the intensity of the rain, and the algorithm 310 may control the windshield wipers to have a given speed based on the intensity of the rain.

In some embodiments, the ECU 102 may be or include an artificial intelligence processor capable of performing one or more artificial intelligence algorithm 312. The artificial intelligence algorithm 312 may be performed in some, all, or none of the other algorithms performed by the ECU 102. The artificial intelligence algorithm 312 may include a machine learning algorithm and may be trained using previously-detected, received, or otherwise obtained data, based on currently received or detected data, or the like. In some embodiments, the ECU 102 may perform another optimization algorithm instead of, or along with, the artificial intelligence algorithm. The artificial intelligence algorithm 312 (or any other optimization algorithm) may, for example, monitor the user preference determinations from the algorithm 302 and may improve the algorithm for determining user preferences based on the monitoring to improve results of the algorithm 302.

Figure 4:
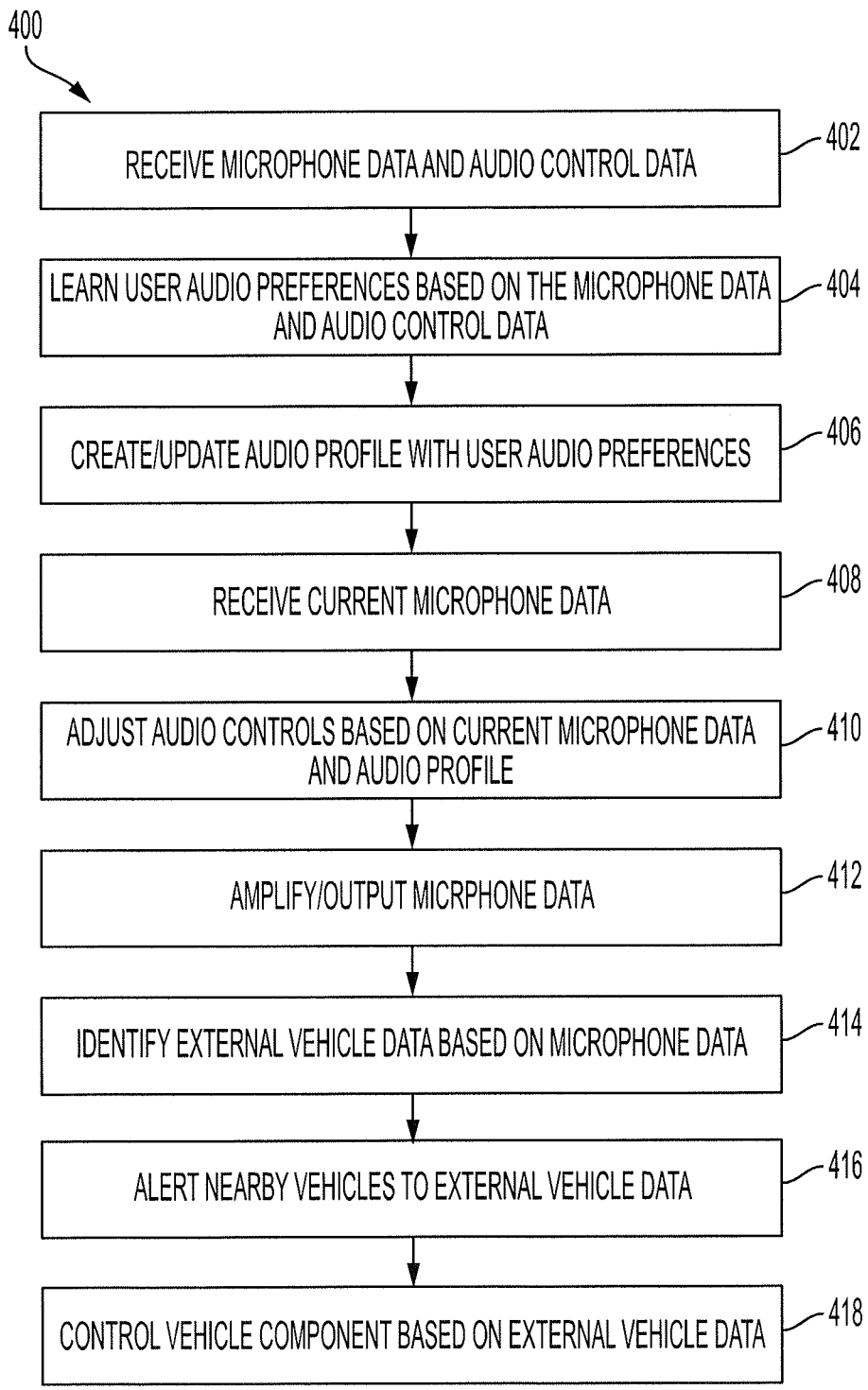
FIG. 4 is a flowchart illustrating a method for learning auxiliary feature preferences and controlling auxiliary vehicle devices based on the preferences according to an embodiment of the present invention.

Referring now to FIG. 4, a method 400 may be performed by components of the vehicle, such as the vehicle 100 of FIG. 1, to learn auxiliary feature preferences and control auxiliary vehicle components based on the learning. The method 400 may begin in block 402 where an ECU of the vehicle may receive microphone data and audio control data. The microphone data may include any audio data captured by one or more microphone associated with the vehicle. The audio data may include speech data, music data, noise data, or the like. The microphone or microphones may be located at various locations inside of the vehicle or outside of the vehicle. In that regard, the microphone data may include any audio captured inside or outside of the vehicle.

The audio control data may include control of an audio system of the vehicle by a user. For example, the audio control data may include a user turning off a stereo system in the vehicle, turning up the volume of music, turning down the volume of music, or the like. The ECU may receive both the microphone data and the audio control data and may identify associations between the microphone data and the audio control data.

In block 404, the ECU may learn user audio preferences based on the associations between the microphone data and the audio control data. The user audio preferences may include situations in which one or more user adjusts audio in the vehicle. For example, the user audio preferences may include the user turning down a radio volume when speech of a specific frequency is heard, may include the user turning up a radio volume when a motorcycle noise is detected outside of the vehicle, or the like.

In block 406, the ECU may create or update an audio profile with the learned user audio preferences from block 404. The ECU may create an audio profile for each passenger in the vehicle or may create a single audio profile that includes audio preferences for each passenger in the vehicle. The audio profile may be stored in a memory on the vehicle and accessed by the ECU. For example, the ECU may access an audio profile for each passenger and driver in a vehicle and may apply each of the audio profiles simultaneously. The ECU may identify the passengers and drivers in any of a variety of manners such as by analyzing image data from a camera in the vehicle, identifying users of mobile devices that are detected by a network access device of the vehicle, identifying users of one or more key fob used in a vehicle, or the like.

In some embodiments, the ECU may transmit the audio profile to a remote server such that another vehicle can retrieve the audio profile for the passenger from the remote server. In some embodiments, the remote server may receive the microphone data and the audio control data, learn the audio preferences, and create or update the audio profile.

The audio profile may be accessible by multiple vehicles. For example, as a user requests a rideshare vehicle, the audio profile may be downloaded to the rideshare vehicle before, while, or after the user enters the rideshare vehicle. In that regard, the rideshare vehicle may operate using the audio profile of one or more passengers of the rideshare vehicle.

The audio profile may include learned user audio preferences for a variety of situations. For example, the audio profile may include user audio preferences for specific frequencies of voice, user audio preferences for amplifying and outputting other specific frequencies of voice, user audio preferences for controlling a volume when ambient noise is relatively great, or the like.

In block 408, the ECU may receive current microphone data from one or more microphone associated with the vehicle. The microphone may include one or more microphone located in a cabin of the vehicle, may include one or more microphone located outside of the cabin of the vehicle (such as on an outside of a main body or in an engine compartment), or the like. The microphone data may include speech data, music data, ambient noise, sirens, or the like.

The ECU may further parse and analyze each element included in the microphone data. For example, the ECU may filter the microphone data to identify each source of audio in the microphone data and identify characteristics of each source. For example, the ECU may identify each passenger based on speech included in the microphone data, may determine a volume of speech of each passenger, may identify a frequency of speech for each passenger, or the like. The ECU may likewise identify the presence of an emergency vehicle siren and may identify the type of emergency vehicle based on characteristics of the siren (e.g., the ECU may identify whether a siren is associated with a police vehicle, an ambulance, or a fire truck based on the frequency and noise pattern of the siren).

In block 410, the ECU may adjust audio controls in the vehicle based on the current microphone data and based on the audio profile. For example, the audio profile may indicate that a user desires music volume to be reduced when a person who speaks at a specific frequency begins speaking. The current microphone data may include speech data having the specific frequency. In such a situation, the ECU may control the volume of the audio to be reduced to or below a threshold volume level. The threshold volume level may be a volume below which the ECU determines that the user can hear and understand the speech of the specific frequency. The ECU may determine the threshold volume level based on user responses to speech of the specific frequency at various volumes, based on previous user control of the volume in response to speech of the specific frequency, or the like.

As another example, the audio profile may indicate that a user has difficulty hearing music when the ambient noise includes noise of a specific frequency or within a specific frequency range, and the current microphone data may include ambient noise of the specific frequency. In response to this situation, the ECU may increase the volume of music inside the vehicle cabin.

In block 412, the ECU may control one or more speaker in the vehicle to amplify and output some or all of the current microphone data. The ECU may take this action based on the current microphone data and the audio profile. For example, the audio profile may indicate that a specific passenger, when sitting in a rear seat of the vehicle, has difficulty hearing passengers located in the front of the vehicle. The current microphone data may indicate that one or more passenger in the front of the vehicle are speaking. Based on this information, the ECU may filter the speech data from the passengers in the front of the vehicle and control one or more speaker (e.g., a speaker in the back of the vehicle) to amplify and output the speech data from the passengers in the front of the vehicle.

In some embodiments, the audio profile may indicate that a passenger has difficulty hearing music in certain situations (such as when the passenger is seated on a passenger side of the vehicle). The ECU may learn that the passenger is seated on the passenger side of the vehicle, and may control one or more speaker on the passenger side of the vehicle to play music at a louder volume than requested via the input device.

In block 414, the ECU may identify external vehicle data based on the current microphone data. For example, a memory of the vehicle may store audio data or other data, and the ECU may compare microphone data to this data in order to identify objects or events outside of the vehicle. The ECU may filter or otherwise parse the microphone data into different elements to isolate each source of microphone data. For example, the ECU may filter the microphone data into speech data of specific users, music playing from a vehicle speaker, raindrops, external engine noise, external sirens, or the like.

The ECU may compare each source of microphone data to the stored audio data in the memory in order to identify each source of microphone data. In some embodiments, the ECU may be programmed to identify each source of microphone data based on the characteristics of the microphone data. For example, the ECU may be programmed to identify that sounds within a specific frequency range and having a specific repetitive pattern may correspond to an emergency vehicle siren, sounds within another specific frequency range may correspond to external engines, and the like.

The types of external vehicle data identifiable by the ECU may include whether rain or thunder is occurring, the presence of emergency vehicles (and type of emergency vehicle), types of vehicles in the vicinity of the present vehicle (e.g., based on engine noise), or the like.

In some embodiments, the ECU may be capable of identifying and diagnosing problems with the present vehicle based on the microphone data. For example, the ECU may isolate a high-frequency noise and determine that the high-frequency noise corresponds to a broken timing belt in the engine. As another example, the ECU may identify that an air pump associated with the vehicle air conditioning unit has gone bad based on a detected sound in the microphone data. The ECU may control an output device to output a notification of the vehicle problem, facilitating repair of the problem by a driver or passenger.

In block 416, the ECU may control a network access device to alert nearby vehicles based on external vehicle data that was identified in block 414. The ECU may make a determination as to whether the external vehicle data is relevant to other vehicles. If the external vehicle data may affect operation or control of one or more other vehicle then the ECU may determine to transmit the external vehicle data. For example, presence of an emergency vehicle siren may affect control of another vehicle because the other vehicle may be required to slow down, change lanes, or the like. In that regard, the ECU may control the network access device to alert nearby vehicles to the presence of, and potentially location or heading of, the emergency vehicle siren. As another example, presence of rain may affect operation of another vehicle because the other vehicle may desire to turn on windshield wipers to increase visibility. In that regard, the ECU may control the network access device to alert nearby vehicles to the presence of rain. In some embodiments, the ECU may further transmit the intensity of the rain to the nearby vehicles to alert the vehicles as to a desirable speed of operation of the windshield wipers.

In block 418, the ECU may control one or more vehicle component based on the external vehicle data. For example, if the vehicle is an autonomous vehicle and the external vehicle data indicates that a police vehicle is approaching the present vehicle, the ECU of the autonomous vehicle may control the vehicle to decelerate and move to a right lane. In a similar example but in a non-autonomous vehicle, the ECU may control an output device to output a notification that a police vehicle is approaching. As another example, if the external vehicle data indicates that rain is present, the ECU may control windshield wipers of the vehicle to turn on in order to increase visibility for a driver.

Where used throughout the specification and the claims, "at least one of A or B" includes "A" only, "B" only, or "A and B." Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for audio control in a vehicle, the system comprising:
   a speaker configured to output vehicle audio data in a cabin of the vehicle at a volume;
   a microphone configured to detect microphone data in the cabin of the vehicle and to detect audio data corresponding to an exterior of the cabin;
   a network access device configured to communicate with a remote vehicle;
   a memory configured to store an audio profile corresponding to desirable operation of the volume of the speaker; and
   an electronic control unit (ECU) coupled to the speaker, the microphone, and the memory and configured to:
      control the volume of the speaker based on the detected microphone data and the audio profile,
      determine an event or situation in the environment of the vehicle based on the audio data corresponding to the exterior of the cabin including audio of the event or situation, and
      control the network access device to transmit a notification to the remote vehicle corresponding to the event or situation in the environment of the vehicle.

2. The system of claim 1 wherein the desirable operation of the volume of the speaker in the audio profile includes turning down the volume of the speaker to a predetermined volume level when a specific user voice is detected, and the ECU is configured to reduce the volume of the speaker to the predetermined volume level in response to the microphone data including the specific user voice.

3. The system of claim 2 wherein the ECU is further configured to filter the microphone data using at least one of sub-spectral subtraction or Kalman filtering to identify the specific user voice in the microphone data.

4. The system of claim 1 wherein the speaker is located in a different location in the cabin of the vehicle than the microphone, the microphone data includes a user voice, and the ECU is further configured to control the speaker to amplify and output the user voice.

5. The system of claim 1 further comprising a volume control input device coupled to the ECU and configured to receive user input corresponding to a desired volume, wherein the ECU is further configured to learn user volume preferences in multiple environments based on historical user input and corresponding historical microphone data, and to update the audio profile with the learned user volume preferences in the multiple environments.

6. The system of claim 5 wherein the learned user volume preferences include a first nonzero user preferred audio volume corresponding to a first frequency of audio in the microphone data and a second nonzero user preferred audio volume that is different from the first nonzero user preferred audio volume and corresponding to a second frequency of audio in the microphone data.

7. The system of claim 1 wherein the microphone data includes an emergency siren from an emergency vehicle, and the ECU is further configured to identify that the emergency vehicle is approaching and to further reduce the volume of the speaker to allow the emergency siren to be heard in the cabin of the vehicle when the microphone data includes the emergency siren.

8. The system of claim 7 wherein the notification transmitted to the remote vehicle indicates that the emergency vehicle is approaching when the microphone data includes the emergency siren.

9. The system of claim 1 further comprising a windshield and a windshield wiper configured to remove fluid from the windshield, wherein the microphone data includes audio data corresponding to raindrops on the vehicle, and the ECU is further configured to identify the raindrops based on the microphone data and to engage the windshield wiper in response to identifying the raindrops.

10. A system for audio control in a vehicle, the system comprising:
    a speaker configured to output vehicle audio data in a cabin of the vehicle at a volume;
    a volume control input device configured to receive user input corresponding to a desired volume of the speaker;
    a microphone configured to detect microphone data in the cabin of the vehicle;
    a memory configured to store an audio profile corresponding to desirable operation of the volume of the speaker; and
    an electronic control unit (ECU) coupled to the speaker, the microphone, and the memory and configured to:
        learn user volume preferences in multiple environments based on historical user input and corresponding historical microphone data, the user volume preferences including a first nonzero user preferred audio volume corresponding to first frequency of audio in the microphone data and a second nonzero user preferred audio volume that is different from the first nonzero user preferred audio volume and corresponding to a second frequency of audio in the microphone data,
        update the audio profile with the learned user volume preferences in the multiple environments, and
        control the volume of the speaker to be set to a corresponding user volume preference of the learned user volume preferences based on the detected microphone data and the audio profile.

11. The system of claim 10 wherein the desirable operation of the volume of the speaker in the audio profile includes turning down the volume of the speaker to a predetermined volume level when a specific user voice is detected, and the ECU is configured to reduce the volume of the speaker to the predetermined volume level in response to the microphone data including the specific user voice.

12. The system of claim 11 wherein the ECU is further configured to filter the microphone data using at least one of sub-spectral subtraction or Kalman filtering to identify the specific user voice in the microphone data.

13. The system of claim 10 wherein the speaker is located in a different location in the cabin of the vehicle than the microphone, the microphone data includes a user voice, and the ECU is further configured to control the speaker to amplify and output the user voice.

14. The system of claim 10 wherein the microphone data includes an emergency siren from an emergency vehicle, and the ECU is further configured to identify that the emergency vehicle is approaching and to further reduce the volume of the speaker to allow the emergency siren to be heard in the cabin of the vehicle when the microphone data includes the emergency siren.

15. The system of claim 14 further comprising a network access device configured to communicate with a remote vehicle, wherein the ECU is further configured to control the network access device to transmit a notification to the remote vehicle indicating that the emergency vehicle is approaching when the microphone data includes the emergency siren.

16. A method for audio control in a vehicle, the method comprising:
    outputting, by a speaker, vehicle audio data in a cabin of the vehicle;
    detecting, by a microphone, microphone data in the cabin of the vehicle;
    storing, in a memory, an audio profile corresponding to desirable operation of the volume of the speaker, the audio profile including user volume preferences including a first nonzero user preferred audio volume corresponding to a first frequency in the microphone data and a second nonzero user preferred audio volume that is different from the first nonzero user preferred audio volume and corresponding to a second frequency of audio in the microphone data; and
    controlling, by an electronic control unit (ECU), the volume of the speaker to be set to a corresponding user volume preference based on the detected microphone data and the audio profile.

17. The method of claim 16 further comprising filtering, by the ECU, the microphone data using at least one of sub-spectral subtraction or Kalman filtering to identify characteristics of the microphone data.

18. The method of claim 16 further comprising:
    receiving, by a volume control input device, user input corresponding to a desired volume of the speaker;
    learning, by the ECU, the user volume preferences in multiple environments based on historical user input and corresponding to historical microphone data; and
    updating, by the ECU, the audio profile with the learned user volume preferences in the multiple environments.

19. The method of claim 16 further comprising:
identifying, by the ECU, that an emergency vehicle is approaching by determining that an emergency siren from the emergency vehicle is included in the microphone data; and
reducing, by the ECU, the volume of the speaker to allow the emergency siren to be heard in the cabin of the vehicle when the ECU identifies that the emergency vehicle is approaching.

* * * * *